US011414780B2

(12) United States Patent
Minamide et al.

(10) Patent No.: US 11,414,780 B2
(45) Date of Patent: Aug. 16, 2022

(54) APPARATUS AND METHOD FOR MANUFACTURING EPITAXIAL WAFER

(71) Applicant: SUMCO CORPORATION, Tokyo (JP)

(72) Inventors: Yu Minamide, Tokyo (JP); Naoyuki Wada, Tokyo (JP); Yasutaka Takemura, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 260 days.

(21) Appl. No.: 16/758,599

(22) PCT Filed: Nov. 5, 2018

(86) PCT No.: PCT/JP2018/041041
§ 371 (c)(1),
(2) Date: Apr. 23, 2020

(87) PCT Pub. No.: WO2019/130826
PCT Pub. Date: Jul. 4, 2019

(65) Prior Publication Data
US 2021/0123159 A1    Apr. 29, 2021

(30) Foreign Application Priority Data
Dec. 28, 2017 (JP) .............................. JP2017-254019

(51) Int. Cl.
*H01L 21/02* (2006.01)
*C30B 25/16* (2006.01)
(Continued)

(52) U.S. Cl.
CPC .......... *C30B 25/16* (2013.01); *C23C 16/4412* (2013.01); *C23C 16/52* (2013.01);
(Continued)

(58) Field of Classification Search
CPC ....... C30B 25/16; C30B 25/14; C30B 35/005; C30B 29/06; C30B 35/00; C30B 25/08;
(Continued)

(56) References Cited

U.S. PATENT DOCUMENTS

2002/0020344 A1   2/2002  Takano
2003/0100194 A1   5/2003  Nakamura
(Continued)

FOREIGN PATENT DOCUMENTS

JP      4-162709 A      6/1992
JP      5-29263 A       2/1993
(Continued)

OTHER PUBLICATIONS

ISR for PCT/JP2018/041041, dated Jan. 8, 2019.
Office Action for JP App. No. 2017-254019, dated Nov. 13, 2018.

*Primary Examiner* — Karen Kusumakar
(74) *Attorney, Agent, or Firm* — Greenblum & Bernstein, P.L.C.

(57) ABSTRACT

The amount of gas evacuation from a reaction chamber of an apparatus for manufacturing epitaxial wafers is controlled to any one of: a first amount of gas evacuation when an epitaxial film formation process is performed in the reaction chamber; a second amount of gas evacuation smaller than the first amount of gas evacuation when a gate valve is opened to load or unload a wafer between the reaction chamber and a wafer transfer chamber; and a third amount of gas evacuation larger than the first amount of gas evacuation until a purge process for a gas in the reaction chamber is completed after the epitaxial film formation process is completed in the reaction chamber.

6 Claims, 3 Drawing Sheets

(51) Int. Cl.
*C23C 16/44* (2006.01)
*C23C 16/52* (2006.01)
*C30B 25/14* (2006.01)
*C30B 35/00* (2006.01)

(52) U.S. Cl.
CPC ............ *C30B 25/14* (2013.01); *C30B 35/005* (2013.01); *H01L 21/0262* (2013.01)

(58) Field of Classification Search
CPC . C23C 16/4412; C23C 16/52; C23C 16/4408; H01L 21/0262; H01L 21/6719; H01L 21/67196; H01L 21/67253; H01L 21/205
See application file for complete search history.

(56) References Cited

U.S. PATENT DOCUMENTS

| | | |
|---|---|---|
| 2007/0032045 A1 | 2/2007 | Kasahara et al. |
| 2017/0338117 A1 | 11/2017 | Tsuji et al. |

FOREIGN PATENT DOCUMENTS

| | | |
|---|---|---|
| JP | 5-259098 A | 10/1993 |
| JP | 10-74817 A | 3/1998 |
| JP | 2000-306903 A | 11/2000 |
| JP | 2001-345279 A | 12/2001 |
| JP | 2003-163212 A | 6/2003 |
| JP | 2007-308730 A | 11/2007 |
| JP | 2012-238772 A | 12/2012 |
| JP | 2013-232455 A | 11/2013 |
| JP | 2015-70097 A | 4/2015 |
| JP | 2016-111226 A | 6/2016 |
| WO | WO 2005/050725 A1 | 6/2005 |

APPARATUS AND METHOD FOR MANUFACTURING EPITAXIAL WAFER

TECHNICAL FIELD

The present invention relates to an apparatus and a method for manufacturing epitaxial wafers.

BACKGROUND ART

A method for manufacturing epitaxial silicon wafers is known, in which an epitaxial growth apparatus is used to form silicon epitaxial films on the top surfaces of silicon wafers provided with polycrystalline silicon films on the back surfaces, wherein the epitaxial growth apparatus includes reaction chambers (process chambers) for growing epitaxial films, a wafer transfer chamber communicating with the reaction chambers and carrying wafers into the reaction chambers, and a partition movable mechanism (gate valve) provided in the interconnection part between each reaction chamber and the wafer transfer chamber and operating to open/close the gas flow between the reaction chamber and the wafer transfer chamber (Patent Document 1).

This method for manufacturing epitaxial wafers includes opening the gate valve in a state in which the pressure of a nitrogen gas atmosphere in the transfer chamber is made higher than the pressure of a hydrogen gas atmosphere in the reaction chamber by 0.067 kPa to 0.267 kPa (0.5 Torr to 2 Torr), carrying a silicon wafer in the transfer chamber into the reaction chamber, and supplying the nitrogen gas in the transfer chamber into the reaction chamber using the difference between the pressure in the transfer chamber and the pressure in the reaction chamber. Then, the silicon wafer is placed on a susceptor provided in the reaction chamber, the gate valve is closed to stop the supply of nitrogen gas into the reaction chamber, and thereafter a silicon epitaxial film is formed on the surface of the silicon wafer.

PRIOR ART DOCUMENT

Patent Document

[Patent Document 1] JP2013-232455A

SUMMARY OF INVENTION

Problems to be Solved by Invention

Thus, in the above prior art, the differential pressure between the reaction chamber and the transfer chamber is set without exception. Unfortunately, if the set differential pressure is large, particles may readily be stirred up when the gate valve is opened, while if the evacuation pressure is lowered to reduce the set differential pressure, evacuation of the particles may be insufficient. In any case, there is a problem in that the quality of LPD (Light Point Defect) deteriorates.

A problem to be solved by the present invention is to provide an apparatus and a method for manufacturing epitaxial wafers with which the quality of LPD can be improved.

Means for Solving Problems

An aspect of the present invention provides an apparatus for manufacturing epitaxial wafers, comprising:
a reaction chamber for growing an epitaxial film on a wafer;
a wafer transfer chamber communicating with the reaction chamber;
a gate valve provided in an interconnection part between the reaction chamber and the transfer chamber, the gate valve opening and closing a gas flow between the reaction chamber and the transfer chamber;
a wafer transfer device provided in the wafer transfer chamber, the wafer transfer device loading an unprocessed wafer from the transfer chamber to the reaction chamber and unloading a processed wafer from the reaction chamber to the wafer transfer chamber;
a first controller for executing control to load the wafer from the wafer transfer chamber to the reaction chamber, perform an epitaxial film formation process in the reaction chamber, and then unload the wafer from the reaction chamber to the wafer transfer chamber;
a first gas evacuator for evacuating a gas in the wafer transfer chamber;
a second gas evacuator for evacuating a gas in the reaction chamber; and
a second controller for controlling an amount of gas evacuation performed by the first gas evacuator and an amount of gas evacuation performed by the second gas evacuator,
the second controller operating to:
control the amount of gas evacuation performed by the first gas evacuator within a predetermined range;
input a control signal for a step of growing the epitaxial film controlled by the first controller; and
control the amount of gas evacuation performed by the second gas evacuator on a basis of the control signal,
wherein the amount of gas evacuation performed by the second gas evacuator is controlled to any one of:
a first amount of gas evacuation when an epitaxial film formation process is performed in the reaction chamber;
a second amount of gas evacuation smaller than the first amount of gas evacuation when the gate valve is opened to load or unload the wafer between the reaction chamber and the wafer transfer chamber; and
a third amount of gas evacuation larger than the first amount of gas evacuation until a purge process for the gas in the reaction chamber is completed after the epitaxial film formation process is completed in the reaction chamber.

In the present invention, the second controller preferably controls the amount of gas evacuation performed by the second gas evacuator to the first amount of gas evacuation or the second amount of gas evacuation during a period from a time point when the epitaxial film formation process is completed in the reaction chamber and the purge process for the gas in the reaction chamber is completed to a time point when the gate valve is opened to unload the wafer into the wafer transfer chamber.

In the present invention, with reference to an evacuation pressure caused by the amount of gas evacuation controlled in the first evacuator, the evacuation pressure caused by the first amount of gas evacuation can be −0.4 to −0.6 kPa, the evacuation pressure caused by the second amount of gas evacuation can be 0 to −0.3 kPa, and the evacuation pressure caused by the third amount of gas evacuation can be −0.7 kPa or lower.

Another aspect of the present invention provides a method for manufacturing epitaxial wafers using an apparatus for manufacturing epitaxial wafers, the apparatus comprising:

a reaction chamber for growing an epitaxial film on a wafer;

a wafer transfer chamber communicating with the reaction chamber;

a gate valve provided in an interconnection part between the reaction chamber and the transfer chamber, the gate valve opening and closing a gas flow between the reaction chamber and the transfer chamber; and a wafer transfer device provided in the wafer transfer chamber, the wafer transfer device loading an unprocessed wafer from the transfer chamber to the reaction chamber and unloading a processed wafer from the reaction chamber to the wafer transfer chamber, the method comprising:

controlling a pressure in the wafer transfer chamber within a predetermined range; and controlling a pressure in the reaction chamber to any one of:

a first pressure when an epitaxial film formation process is performed in the reaction chamber;

a second pressure higher than the first pressure when the gate valve is opened to load or unload the wafer between the reaction chamber and the wafer transfer chamber; and a third pressure lower than the first pressure until a purge process for a gas in the reaction chamber is completed after the epitaxial film formation process is completed in the reaction chamber.

In the present invention, the pressure in the reaction chamber is preferably controlled to the first pressure or the second pressure during a period from a time point when the epitaxial film formation process is completed in the reaction chamber and the purge process for the gas in the reaction chamber is completed to a time point when the gate valve is opened to unload the wafer into the wafer transfer chamber.

Effect of Invention

According to the present invention, when the gate valve is opened to load or unload the wafer between the reaction chamber and the wafer transfer chamber, the amount of gas evacuation performed by the second gas evacuation is controlled to the second amount of gas evacuation smaller than the first amount of gas evacuation used during the generation of the epitaxial film; therefore, the differential pressure between the reaction chamber and the wafer transfer chamber is reduced, and dust such as particles in the wafer transfer chamber can be suppressed from flowing into the reaction chamber to attach to the wafer. On the other hand, until the purge process for the gas in the reaction chamber is completed after the epitaxial film formation process is completed in the reaction chamber, the amount of gas evacuation performed by the second gas evacuation is controlled to the third amount of gas evacuation larger than the first amount of gas evacuation used during the generation of the epitaxial film, and dust such as particles occurring in the reaction chamber can therefore be evacuated outside the reaction chamber without attaching to the wafer. As a result, the quality of LPD can be improved.

MODE(S) FOR CARRYING OUT THE INVENTION

Figure 1:
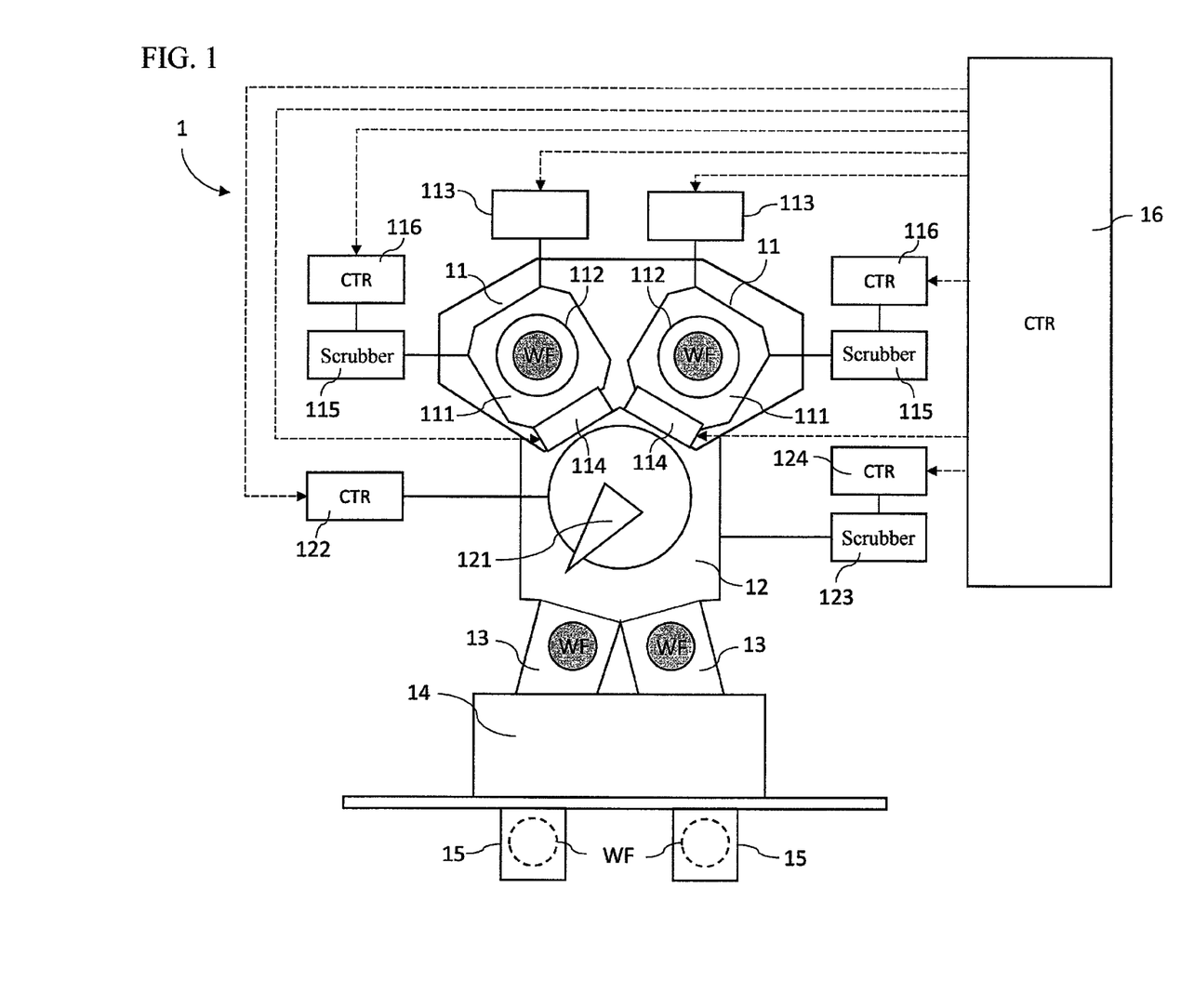
FIG. 1 is a block diagram illustrating an apparatus for manufacturing epitaxial wafers according to an embodiment of the present invention.

Hereinafter, one or more embodiments of the present invention will be described with reference to the drawings. FIG. 1 is a block diagram illustrating an apparatus 1 for manufacturing epitaxial wafers (also simply referred to as a "manufacturing apparatus 1," hereinafter) according to an embodiment of the present invention, in which the plan view of an apparatus main body is illustrated in the middle. The manufacturing apparatus 1 of the present embodiment is a so-called atmospheric pressure CVD apparatus and includes a pair of reaction furnaces 11 and 11, a wafer transfer chamber 12 in which a wafer handling robot 121 for handling one or more wafers WF such as single crystal silicon wafers is installed, a pair of load lock chambers 13, a factory interface 14, and cassette cases 15 in each of which a plurality of wafers WF is stored. Although illustration is omitted, the factory interface 14 is provided with a transfer apparatus that takes out (unloads) unprocessed wafers WF stored in the cassette cases 15 to put (load) them into the load lock chambers 13 and stores processed wafers WF carried into the load lock chambers 13 in the cassette cases 15.

Each load lock chamber 13 is provided with airtight doors between the load lock chamber 13 and the wafer transfer chamber 12 and between the load lock chamber 13 and the factory interface 14 and serves as a space for replacing the atmosphere gas between the wafer transfer chamber 12 having an inert gas atmosphere and the factory interface 14 having an air atmosphere. For example, when an unprocessed wafer WF is carried from a cassette case 15 to the wafer transfer chamber 12, the wafer WF in the cassette case 15 is carried into the load lock chamber 13 via the factory interface 14 in a state in which the door on the factory interface 14 side is opened and the door on the wafer transfer chamber 12 side is closed, then the door on the factory interface 14 side is closed to replace the atmosphere in the load lock chamber 13 with an inert gas atmosphere, and thereafter the door on the wafer transfer chamber 12 side is opened to carry the wafer WF into the wafer transfer chamber 12. On the other hand, when a processed wafer WF is carried from the wafer transfer chamber 12 to a cassette case 15, the wafer WF in the wafer transfer chamber 12 is carried into the load lock chamber 13 in a state in which the door on the wafer transfer chamber 12 side is opened and the door on the factory interface 14 side is closed, then the door on the wafer transfer chamber 12 side is closed to replace the atmosphere in the load lock chamber 13 with an air atmosphere, and thereafter the door on the factory interface 14 side is opened to carry the wafer WF into the cassette case 15 via the factory interface 14.

The wafer transfer chamber 12 is composed of a sealed chamber, and ports on one side of the wafer transfer chamber 12 are connected to the load lock chambers 13 via openable and closable airtight doors while ports on the other side of the wafer transfer chamber 12 are connected to the reaction furnaces 11 via openable and closable airtight gate valves 114. As described above, the wafer transfer chamber 12 is installed with the wafer handling robot 121 which carries unprocessed wafers WF from the load lock chambers 13 to reaction chambers 111 and carries processed wafers WF from the reaction chambers 111 to the load lock chambers 13. The wafer handling robot 121 performs a handling operation in accordance with an operation trajectory that is preliminarily instructed by a robot controller 122. The robot controller 122 and a first controller 16 that is responsible for overall control of the manufacturing apparatus 1 for epitaxial wafers mutually transmit and receive control signals. When operation command signals from the first controller 16 are transmitted to the robot controller 122, the robot controller 122 controls the operation of the wafer handling robot 121. Then, operation results of the wafer handling robot 121 are transmitted from the robot controller 122 to the first controller 16 thereby to allow the first controller 16 to recognize the operation state of the wafer handling robot 121.

An inert gas is supplied to the wafer transfer chamber 12 from an inert gas supply apparatus, which is not illustrated. The gas in the wafer transfer chamber 12 is clarified by a scrubber (cleaning and dust-collecting apparatus) 123 connected to an outlet port of the wafer transfer chamber 12 and then released outside the system. Although detailed illustration is omitted, a conventionally known pressurized water-type scrubber can be used, for example, as the scrubber 123. This type of pressurized water-type scrubber introduces a gas to be evacuated from the outlet port to a venturi tube or the like and sprays the pressurized water into the venturi tube, thereby to remove the dust contained in the gas. In addition to this, when the pressurized water is supplied to the venturi tube together with the gas, the gas from the outlet port is suctioned by the ejector effect, and the scrubber therefore serves as a kind of gas evacuation apparatus. The pressurized water of the scrubber 123 is supplied by a circulation pump that circulates the water stored in a water storage tank provided in the scrubber. The flow rate of water circulated by the circulation pump is controlled by a third controller 124. Control of the circulation pump by the third controller 124 is executed on the basis of command signals from the first controller 16. For example, when the pressure in the wafer transfer chamber 12 is reduced by the gas evacuation function of the scrubber 123, the flow rate of water circulated by the circulation pump of the scrubber 123 can be increased, while when the pressure in the wafer transfer chamber 12 is increased, the flow rate of water circulated by the circulation pump of the scrubber 123 can be reduced. Additionally or alternatively, control to change the pressure is possible by opening or closing a flow path using a butterfly valve, a needle valve, or the like. Control of the pressure in the wafer transfer chamber 12 will be described later. A gas evacuation pump may be provided as substitute for or in addition to the scrubber 123, and the third controller 124 may be configured to control the amount of gas evacuation performed by the gas evacuation pump. The scrubber 123 and/or the gas evacuation pump correspond to the first gas evacuator according to the present invention.

Each reaction furnace 11 is an apparatus for forming an epitaxial film on the surface of a wafer WF by the CVD method and includes a reaction chamber 111. The reaction furnace 11 is provided with a susceptor 112 that rotates the wafer WF placed in the reaction chamber 111 and a gas supply apparatus 113 that supplies a hydrogen gas and a raw material gas (such as silicon tetrachloride $SiCl_4$ or trichlorosilane $SiHCl_3$) for generating an epitaxial film into the reaction chamber 111. Although illustration is omitted, one or more heating lamps for raising the temperature of the wafer WF to a predetermined temperature are provided around the reaction chamber 111. The gate valve 114 is provided between the reaction chamber 111 and the wafer transfer chamber 12, and the airtightness between the reaction chamber 111 and the wafer transfer chamber 12 is ensured by closing the gate valve 114. The driving of susceptor 112 of the reaction furnace 11, the supply/stop of gas performed by the gas supply apparatus 113, the ON/OFF of the heating lamps, and the opening/closing operation of the gate valve 114 are controlled by command signals from the first controller 16. The manufacturing apparatus 1 for epitaxial wafers illustrated in FIG. 1 is exemplified in which a pair of the reaction furnaces 11 and 11 is provided, but a single reaction furnace 11 may be provided or three or more reaction furnaces 11 may also be provided.

Each reaction furnace 11 is also provided with a scrubber 115 having a similar configuration to that of the wafer transfer chamber 12. That is, a hydrogen gas or a raw material gas supplied from the gas supply apparatus 113 is clarified by the scrubber (cleaning and dust-collecting apparatus) 115 connected to an outlet port of the reaction furnace 11 and then released outside the system. Although detailed illustration is omitted also for the scrubber 115, a conventionally known pressurized water-type scrubber can be used, for example, as the scrubber 115. This type of pressurized water-type scrubber introduces a gas to be evacuated from the outlet port to a venturi tube or the like and sprays the pressurized water into the venturi tube, thereby to remove the dust contained in the gas to be evacuated. In addition to this, when the pressurized water is supplied to the venturi tube together with the gas, the gas from the outlet port is suctioned by the ejector effect, and the scrubber therefore serves as a kind of gas evacuation apparatus. The pressurized water of the scrubber 115 is supplied by a circulation pump that circulates the water stored in a water storage tank provided in the scrubber. The flow rate of water circulated by the circulation pump is controlled by a second controller 116. Control of the circulation pump by the second controller 116 is executed on the basis of command signals from the first controller 16. For example, when the pressure in the reaction chamber 111 is reduced by the gas evacuation function of the scrubber 115, the flow rate of water circulated by the circulation pump of the scrubber 115 can be increased, while when the pressure in the reaction chamber 111 is increased, the flow rate of water circulated by the circulation pump of the scrubber 115 can be reduced. Additionally or alternatively, control to change the pressure is possible by opening or closing a flow path using a butterfly valve. Control of the pressure in the reaction chamber 111 will be described later. A gas evacuation pump may be provided as substitute for or in addition to the scrubber 115, and the second controller 116 may be configured to control the amount of gas evacuation performed by the gas evacuation pump. The scrubber 115 and/or the gas evacuation pump correspond to the second gas evacuator according to the present invention.

Figure 3:
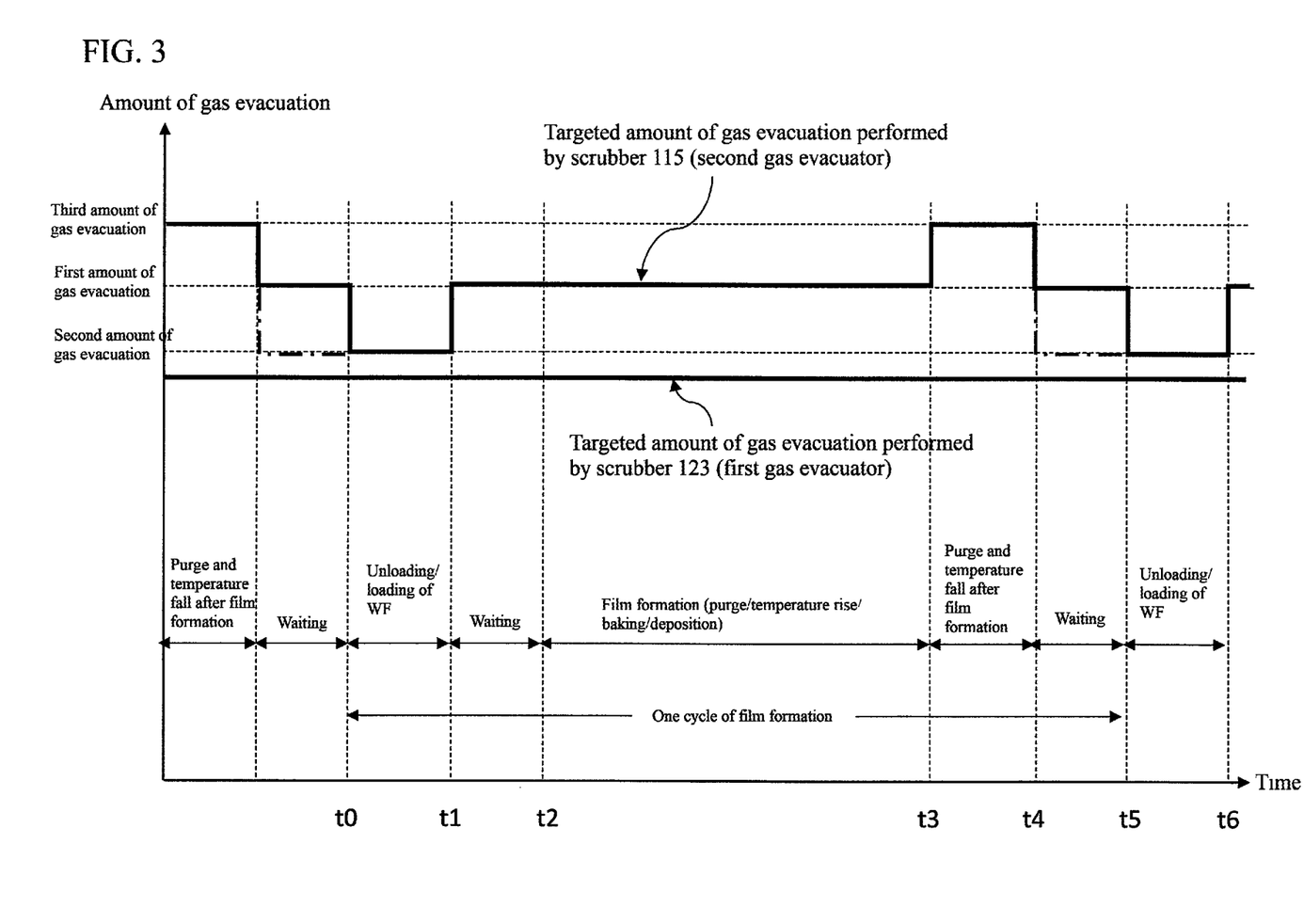
FIG. 3 is a time chart illustrating control content executed by a first controller and the second controller of the apparatus for manufacturing epitaxial wafers of FIG. 1.

A procedure of generation of an epitaxial film in each reaction furnace 11 will be described with reference to FIG. 3. FIG. 3 is a time chart illustrating control content executed by the first controller 16 and second controller 116 of the manufacturing apparatus 1 for epitaxial wafers of the present embodiment, in which steps of generating the epitaxial film in each reaction furnace 11 are illustrated in the lower part of FIG. 3. Time t0 to time t5 on the horizontal axis indicates one cycle of the film formation. First, at time t0, the gate valve 114 is opened and the wafer handling robot 121 is used to unload a previously processed wafer WF and place an unprocessed wafer WF on the susceptor 112 of the reaction chamber 111. After closing the gate valve 114 at time t1 and waiting until time t2, the gas supply apparatus 113 supplies the hydrogen gas into the reaction chamber 111 at time t2 to make the reaction chamber 111 a hydrogen gas atmosphere. Then, the heating lamps are turned on to raise the temperature of the wafer WF in the reaction chamber 111 to a predetermined temperature, pretreatment such as etching or heat treatment is performed as necessary, and thereafter the gas supply apparatus 113 supplies the raw material gas while controlling the flow rate and/or the supply time. Through this operation, an epitaxial film is generated on the surface of the wafer WF at time t3. Then, at time t3, the gas supply apparatus 113 supplies the hydrogen gas again into the reaction chamber 111 to replace the atmosphere of the reaction chamber 111 with a hydrogen gas atmosphere. Then, after waiting from time t4 to time t5, the gate valve 114 is opened at time t5, and the wafer handling robot 121 is used from time t5 to t6 to unload the currently processed wafer WF and place a next unprocessed wafer WF on the susceptor 112 of the reaction chamber 111.

In a conventional atmospheric pressure CVD apparatus, scrubbers 115 and 123 as described above are provided for a reaction chamber 111 and a wafer transfer chamber 12, respectively, but the scrubbers 115 and 123 are used only for the primary gas clarification, and control of the amount of gas evacuation is not performed at all even through a gas evacuation function is provided. In contrast, in the manufacturing apparatus 1 for epitaxial wafers of the present embodiment, the gas evacuation functions of the scrubbers 115 and 123 are focused on, and the amount of gas evacuation performed by each of the scrubbers 115 and 123 is controlled in association with the above-described steps of generating an epitaxial film, thereby to control the pressure of the reaction chamber 111 itself and the differential pressure between the reaction chamber 111 and the wafer transfer chamber 12, thus suppressing the attachment of dust such as particles to a wafer WF. This specific control will be described with reference to FIGS. 2 and 3.

Figure 2:
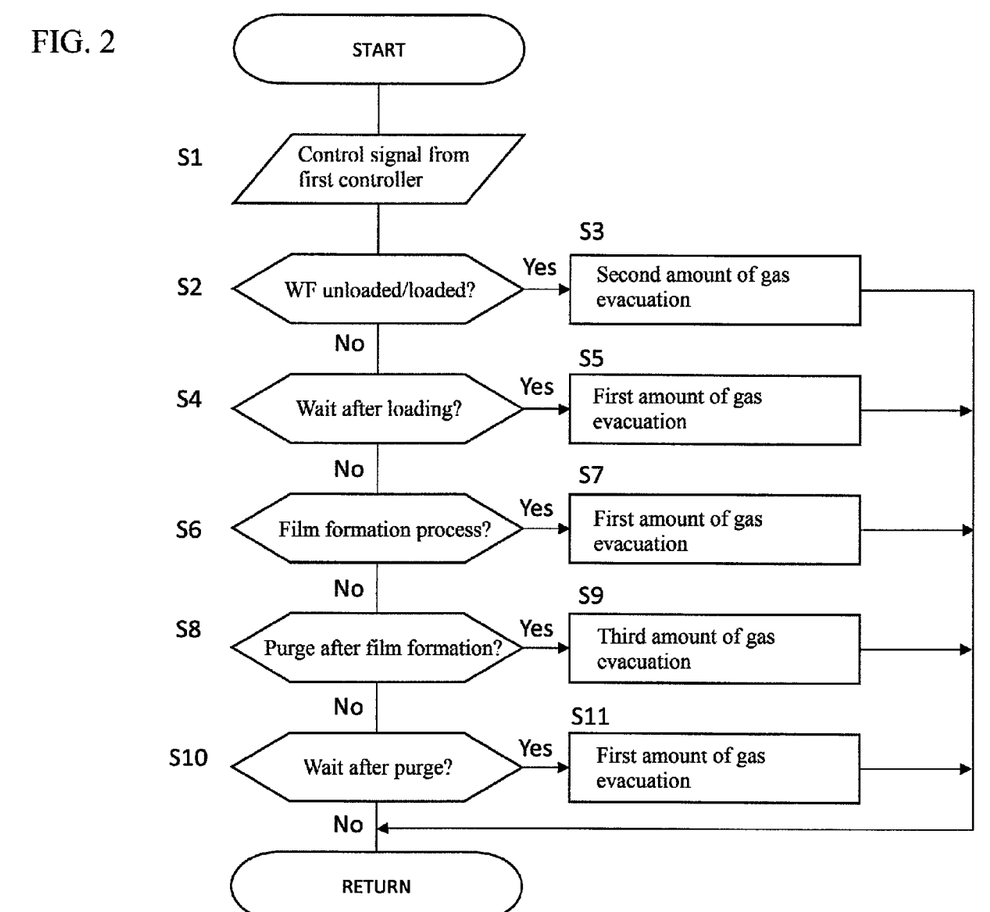
FIG. 2 is a flowchart illustrating a control procedure executed by a second controller of the apparatus for manufacturing epitaxial wafers of FIG. 1.

FIG. 2 is a flowchart illustrating a control procedure executed by the second controller 116 of the manufacturing apparatus 1 for epitaxial wafers of the present embodiment, and the upper part of FIG. 3 is a time chart illustrating transition of the amount of gas evacuation from the reaction chamber 111, which is achieved by the control performed by the second controller 116. Calculation in the flowchart illustrated in FIG. 2 is executed at predetermined time intervals (e.g., 10 msec). The vertical axis of FIG. 3 represents the amount of gas evacuation from the reaction chamber 111 performed by the scrubber 115 and the amount of gas evacuation from the wafer transfer chamber 12 performed by the scrubber 123. Thus, the magnitude relationship between the pressures in the reaction chamber 111 and in the wafer transfer chamber 12 varies to some extent depending on the amount of supplied gas, but the pressures are substantially the same when unloading/loading a wafer, the pressure in the reaction chamber is a lower pressure during the film formation, and the pressure in the wafer reaction chamber is a further lower pressure during the purge after the film formation.

In the manufacturing apparatus 1 for epitaxial wafers of the present embodiment, the third controller 124 controls the amount of gas evacuation performed by the scrubber 123 so that, as illustrated in the graph in FIG. 3 of a targeted amount of gas evacuation performed by the scrubber 123 (first gas evacuator), the amount of gas evacuation falls within a predetermined range (some error may be accepted), that is, the amount of gas evacuation is controlled to a fixed amount. The amount of gas evacuation performed by the scrubber 115 connected to the reaction chamber 111 can be set to any of three levels of a first amount of gas evacuation, a second amount of gas evacuation, and a third amount of gas evacuation, which satisfy the relationship of "the second amount of gas evacuation<the first amount of gas evacuation<the third amount of gas evacuation" as illustrated in FIG. 3. Although not particularly limited, the three-level setting of the amount of gas evacuation allows the difference between the pressure in the wafer transfer chamber 12 and the pressure in the reaction chamber 111 to change as follows. That is, with reference to the evacuation pressure caused by the amount of gas evacuation controlled in the scrubber 123, the evacuation pressure caused by the first amount of gas evacuation is set to −0.4 to −0.6 kPa, the evacuation pressure caused by the second amount of gas evacuation is set to 0 to −0.3 kPa, and the evacuation pressure caused by the third amount of gas evacuation is set to −0.7 kPa or lower.

In step S1 of FIG. 2, the second controller 116 inputs a control signal from the first controller 16 to the manufacturing apparatus 1. The control signal includes a command signal that is output in each step of generating an epitaxial film illustrated in the lower part of FIG. 3, and the second controller 116 can recognize which step is currently being executed.

When the control signal from the first controller 16 input in step S1 indicates the unloading/loading of a wafer WF in the reaction chamber 111, the process proceeds to step S3, in which the flow rate of water circulated by the circulation pump is reduced so that the amount of gas evacuation performed by the scrubber 115 becomes the second amount of gas evacuation. Through this operation, as illustrated from time t0 to time t1 in FIG. 3, the amount of gas evacuation from the reaction chamber 111 is reduced thereby to allow the pressure in the reaction chamber 111 to become equal to or close to the pressure in the wafer transfer chamber 12. This can result in the suppression of occurrence of the dust such as particles (i.e., stirred-up dust) due to the pressure variation at the moment when the gate valve 114 is opened and can also result in the suppression of attachment of the dust such as particles to the wafer WF due to flowing from the wafer transfer chamber 12 to the reaction chamber 111.

In step S2, when the control signal from the first controller 16 does not indicate the unloading/loading of a wafer WF in the reaction chamber 111, the process proceeds to step S4. Then, when the control signal from the first controller 16 is a waiting signal after the unloading/loading of a wafer WF, the process proceeds to step S5. The waiting signal being input represents a state in which the unloading/loading of a wafer WF is completed and the gate valve 114 is closed. In step S5, the second controller 116 sets the flow rate of water circulated by the circulation pump to a medium level so that the amount of gas evacuation performed by the scrubber 115 becomes the first amount of gas evacuation. Through this operation, as illustrated from time t1 to time t2 in FIG. 3, the amount of gas evacuation from the reaction chamber 111 becomes the same as the amount of gas evacuation when performing the subsequent film formation step, and the process can smoothly transition to the film formation step.

In step S4, when the control signal from the first controller 16 is not a waiting signal after the unloading/loading of a wafer WF, the process proceeds to step S6. Then, when the control signal from the first controller 16 is a film formation process signal, the process proceeds to step S7. In step S7, the second controller 116 sets the flow rate of water circulated by the circulation pump to a medium level so that the amount of gas evacuation performed by the scrubber 115 becomes the first amount of gas evacuation. Through this operation, as illustrated from time t2 to time t3 in FIG. 3, the amount of gas evacuation from the reaction chamber 111 becomes an amount of gas evacuation for performing the film formation step. In this state, the film formation process for an epitaxial film is performed (purge→temperature rise→baking→deposition).

In step 6, when the control signal from the first controller 16 is not the epitaxial film generation process signal, the process proceeds to step S8. Then, when the control signal from the first controller 16 is a process signal for hydrogen gas purge after the epitaxial firm formation process, the process proceeds to step S9. The hydrogen gas purge signal being input represents a state in which the gate valve 114 is still closed. In step S9, the second controller 116 increases the flow rate of water circulated by the circulation pump so that the amount of gas evacuation performed by the scrubber 115 becomes the third amount of gas evacuation. Through this operation, as illustrated from time t3 to time t4 in FIG. 3, the amount of gas evacuation from the reaction chamber 111 increases thereby to allow the dust such as particles caused in the reaction chamber 111 to be evacuated outside the reaction chamber 111 via the scrubber 115 without attaching to a wafer WF.

In step 8, when the control signal from the first controller 16 is not the process signal for hydrogen gas purge after the epitaxial film generation process, the process proceeds to step S10. Then, when the control signal from the first controller 16 is a waiting signal after the hydrogen gas purge, the process proceeds to step S11. The waiting signal after the hydrogen gas purge being input represents a state in which the gate valve 114 is still closed. In step S11, the second controller 116 sets the flow rate of water circulated by the circulation pump to a medium level so that the amount of gas evacuation performed by the scrubber 115 becomes the first amount of gas evacuation. Through this operation, as illustrated from time t4 to time t5 in FIG. 3, the amount of gas evacuation comes close to the second amount of gas evacuation executed in the subsequent step of unloading/loading a wafer WF, and it is therefore possible to reduce the pressure difference between the wafer transfer chamber 12 and the reaction chamber 111 at the moment when the gate valve 114 is opened at time t5. In step S11, the second controller 116 may reduce the flow rate of water circulated by the circulation pump so that the amount of gas evacuation performed by the scrubber 115 becomes the second amount of gas evacuation. In step S11, when the amount of gas evacuation performed by the scrubber 115 is set to the first amount of gas evacuation, an effect can be obtained in balancing between the effect of removing the dust evacuated from the reaction chamber 111 and the reduction in the differential pressure at the moment when the gate valve 114 is opened at time t5. On the other hand, when the amount of gas evacuation performed by the scrubber 115 is set to the second amount of gas evacuation in step S11, the effect of removing the dust evacuated from the reaction chamber 111 may deteriorate to some extent, but the differential pressure at the moment when the gate valve 114 is opened at time t5 is significantly reduced, so that the occurrence of the dust such as particles (i.e., stirred-up dust) is suppressed, and it is possible to more enhance the effect of suppressing the attachment of the dust such as particles to a wafer WF due to flowing from the wafer transfer chamber 12 to the reaction chamber 111.

In step S10, when the control signal from the first controller 16 is not the waiting signal after the hydrogen gas purge, the process returns to step S1, from which the above procedure is repeated.

As described above, in the manufacturing apparatus 1 for epitaxial wafers of the present embodiment, the gas evacuation functions of the scrubbers 115 and 123 are focused on, and the amount of gas evacuation performed by each of the scrubbers 115 and 123 is controlled in association with the steps of generating an epitaxial film, thereby to control the pressure of the reaction chamber 111 itself and the differential pressure between the reaction chamber 111 and the wafer transfer chamber 12, thus suppressing the attachment of dust such as particles to a wafer WF. Epitaxial wafers (N=1413) according to examples controlled in such a manner and epitaxial wafers (N=1389) according to comparative examples in a case of fixed amounts of gas evacuation performed by the scrubbers 115 and 123 were actually manufactured, and the epitaxial defects were evaluated at 200 nm or more in the DCO (Darkfield Composite Oblique) mode of the SP2 (Surfscan SPS available from KLA Tencor). The number of epitaxial defects per wafer was 0.132 defects/WF in the comparative examples, but 0.118 defects/WF in the examples.

DESCRIPTION OF REFERENCE NUMERALS

1 Manufacturing apparatus for epitaxial wafers
   11 Reaction furnace
      111 Reaction chamber
      112 Susceptor
      113 Gas supply apparatus
      114 Gate valve
      115 Scrubber
      116 Second controller
   12 Wafer transfer chamber
      121 Wafer handling robot
      122 Robot controller
      123 Scrubber
      124 Third controller
   13 Load lock chamber
   14 Factory interface
   15 Cassette case
   16 First controller
WF Wafer

The invention claimed is:

1. An apparatus for manufacturing epitaxial wafers, comprising:
a reaction chamber for growing an epitaxial film on a wafer;
a wafer transfer chamber communicating with the reaction chamber;
a gate valve provided in an interconnection part between the reaction chamber and the wafer transfer chamber, the gate valve opening and closing a gas flow between the reaction chamber and the wafer transfer chamber;
a wafer transfer device provided in the wafer transfer chamber, the wafer transfer device loading an unprocessed wafer from the wafer transfer chamber to the reaction chamber and unloading a processed wafer from the reaction chamber to the wafer transfer chamber;
a first controller for executing control to load the wafer from the wafer transfer chamber to the reaction chamber, perform an epitaxial film formation process in the reaction chamber, and then unload the wafer from the reaction chamber to the wafer transfer chamber;

a first gas evacuator for evacuating a gas in the wafer transfer chamber;

a second gas evacuator for evacuating a gas in the reaction chamber; and a second controller for controlling an amount of gas evacuation performed by the first gas evacuator and an amount of gas evacuation performed by the second gas evacuator, the second controller operating to:

controlling the amount of gas evacuation performed by the first gas evacuator within a predetermined range;

input a control signal for a step of growing the epitaxial film controlled by the first controller; and control the amount of gas evacuation performed by the second gas evacuator on a basis of the control signal, wherein the amount of gas evacuation performed by the second gas evacuator is controlled to any one of:

a first amount of gas evacuation when an epitaxial film formation process is performed in the reaction chamber;

a second amount of gas evacuation smaller than the first amount of gas evacuation when the gate valve is opened to load or unload the wafer between the reaction chamber and the wafer transfer chamber; and a third amount of gas evacuation larger than the first amount of gas evacuation until a purge process for the gas in the reaction chamber is completed after the epitaxial film formation process is completed in the reaction chamber.

2. The apparatus for manufacturing epitaxial wafers according to claim 1, wherein the second controller controls the amount of gas evacuation performed by the second gas evacuator to the first amount of gas evacuation or the second amount of gas evacuation during a period from a time point when the epitaxial film formation process is completed in the reaction chamber and the purge process for the gas in the reaction chamber is completed to a time point when the gate valve is opened to unload the wafer into the wafer transfer chamber.

3. The apparatus for manufacturing epitaxial wafers according to claim 1, wherein, with reference to an evacuation pressure caused by the amount of gas evacuation controlled in the first evacuator, the evacuation pressure caused by the first amount of gas evacuation is −0.4 to −0.6 kPa, the evacuation pressure caused by the second amount of gas evacuation is 0 to −0.3 kPa, and the evacuation pressure caused by the third amount of gas evacuation is −0.7 kPa or lower.

4. The apparatus for manufacturing epitaxial wafers according to claim 2, wherein, with reference to an evacuation pressure caused by the amount of gas evacuation controlled in the first evacuator, the evacuation pressure caused by the first amount of gas evacuation is −0.4 to −0.6 kPa, the evacuation pressure caused by the second amount of gas evacuation is 0 to −0.3 kPa, and the evacuation pressure caused by the third amount of gas evacuation is −0.7 kPa or lower.

5. A method for manufacturing epitaxial wafers using an apparatus for manufacturing epitaxial wafers, the apparatus comprising:

a reaction chamber for growing an epitaxial film on a wafer;

a wafer transfer chamber communicating with the reaction chamber;

a gate valve provided in an interconnection part between the reaction chamber and the wafer transfer chamber, the gate valve opening and closing a gas flow between the reaction chamber and the wafer transfer chamber;

a wafer transfer device provided in the wafer transfer chamber, the wafer transfer device loading an unprocessed wafer from the wafer transfer chamber to the reaction chamber and unloading a processed wafer from the reaction chamber to the wafer transfer chamber;

a first gas evacuator for evacuating a gas in the wafer transfer chamber; and a second gas evacuator for evacuating a gas in the reaction chamber, the method comprising:

controlling a pressure in the wafer transfer chamber within a predetermined range by controlling an amount of gas evacuation from the wafer transfer chamber performed by the first gas evacuator;

controlling a pressure in the reaction chamber by controlling an amount of gas evacuation from the reaction chamber performed by the second gas evacuator; and controlling the pressure in the reaction chamber to:

a first pressure when an epitaxial film formation process is performed in the reaction chamber;

a second pressure higher than the first pressure when the gate valve is opened to load or unload the wafer between the reaction chamber and the wafer transfer chamber; and a third pressure lower than the first pressure until a purge process for a gas in the reaction chamber is completed after the epitaxial film formation process is completed in the reaction chamber.

6. The method for manufacturing epitaxial wafers according to claim 5, wherein the pressure in the reaction chamber is controlled to the first pressure or the second pressure during a period from a time point when the epitaxial film formation process is completed in the reaction chamber and the purge process for the gas in the reaction chamber is completed to a time point when the gate valve is opened to unload the wafer into the wafer transfer chamber.

* * * * *